US011106379B2

(12) United States Patent
Saad et al.

(10) Patent No.: US 11,106,379 B2
(45) Date of Patent: Aug. 31, 2021

(54) MULTI CLOUD ASYNCHRONOUS ACTIVE/ACTIVE TRANSACTIONAL STORAGE FOR AVAILABILITY

(71) Applicant: EMC IP Holding Company LLC, Hopkinton, MA (US)

(72) Inventors: Yossef Saad, Gannei Tikva (IL); Assaf Natanzon, Tel Aviv (IL)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 17 days.

(21) Appl. No.: 16/248,544

(22) Filed: Jan. 15, 2019

(65) Prior Publication Data

US 2020/0225864 A1 Jul. 16, 2020

(51) Int. Cl.
*G06F 3/06* (2006.01)
*H03M 13/15* (2006.01)
*G06F 11/10* (2006.01)

(52) U.S. Cl.
CPC ............ *G06F 3/0647* (2013.01); *G06F 3/064* (2013.01); *G06F 3/067* (2013.01); *G06F 3/0619* (2013.01); *G06F 11/1076* (2013.01); *H03M 13/1515* (2013.01)

(58) Field of Classification Search
CPC ...... G06F 3/0647; G06F 3/067; G06F 3/0619; G06F 3/064; G06F 11/1076; H03M 13/1515
See application file for complete search history.

(56) References Cited

U.S. PATENT DOCUMENTS

| | | | | |
|---|---|---|---|---|
| 7,571,483 B1 * | 8/2009 | Bascle | ................ | H04L 63/1408 726/24 |
| 7,908,448 B1 * | 3/2011 | Chatterjee | ........... | G06F 11/2064 707/655 |
| 9,552,217 B2 * | 1/2017 | Tarasuk-Levin | .... | G06F 9/45558 |
| 2011/0246766 A1 * | 10/2011 | Orsini | ................. | G06F 11/1076 713/160 |
| 2012/0047339 A1 * | 2/2012 | Decasper | ............ | G06F 11/1076 711/162 |
| 2015/0356110 A1 * | 12/2015 | Lin | ..................... | G06F 16/1827 707/704 |

\* cited by examiner

*Primary Examiner* — David Yi
*Assistant Examiner* — Alan Otto
(74) *Attorney, Agent, or Firm* — Womble Bond Dickinson (US) LLP

(57) ABSTRACT

A method, apparatus, and system for storing data at a multi cloud-based storage system is disclosed. The operations comprise: receiving a data block at a first cloud of a multi cloud-based storage system for storage, the multi cloud-based storage system comprising a first number (n) of clouds; generating the first number (n) of coded blocks at the first cloud based on the data block, wherein the data block is recoverable from any second number (k) out of the first number (n) of coded blocks, and wherein the second number (k) is greater than 1 and less than the first number (n); and distributing, by the first cloud, the first number (n) of coded blocks to the first number (n) of clouds of the multi cloud-based storage system, each of the clouds including the first cloud receiving a respective one of the first number (n) of coded blocks for storage.

24 Claims, 4 Drawing Sheets

MULTI CLOUD ASYNCHRONOUS ACTIVE/ACTIVE TRANSACTIONAL STORAGE FOR AVAILABILITY

FIELD OF THE INVENTION

Embodiments of the present invention relate generally to data storage systems. More particularly, embodiments of the invention relate to increasing availability and security in a multi cloud-based storage system.

BACKGROUND

As more and more clouds are becoming available, sensitive data is moved into cloud storage. When there is a security breach, on-premises IT can mitigate the breach by physically disconnecting the network and blocking access to the data, whereas in the cloud there is no ability to block access to the data once an account has been compromised. Another problem with the cloud storage is that cloud-based block storage is not as available as on-premises block storage, and techniques such as local mirroring are also not possible as there is dependency between the disks.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
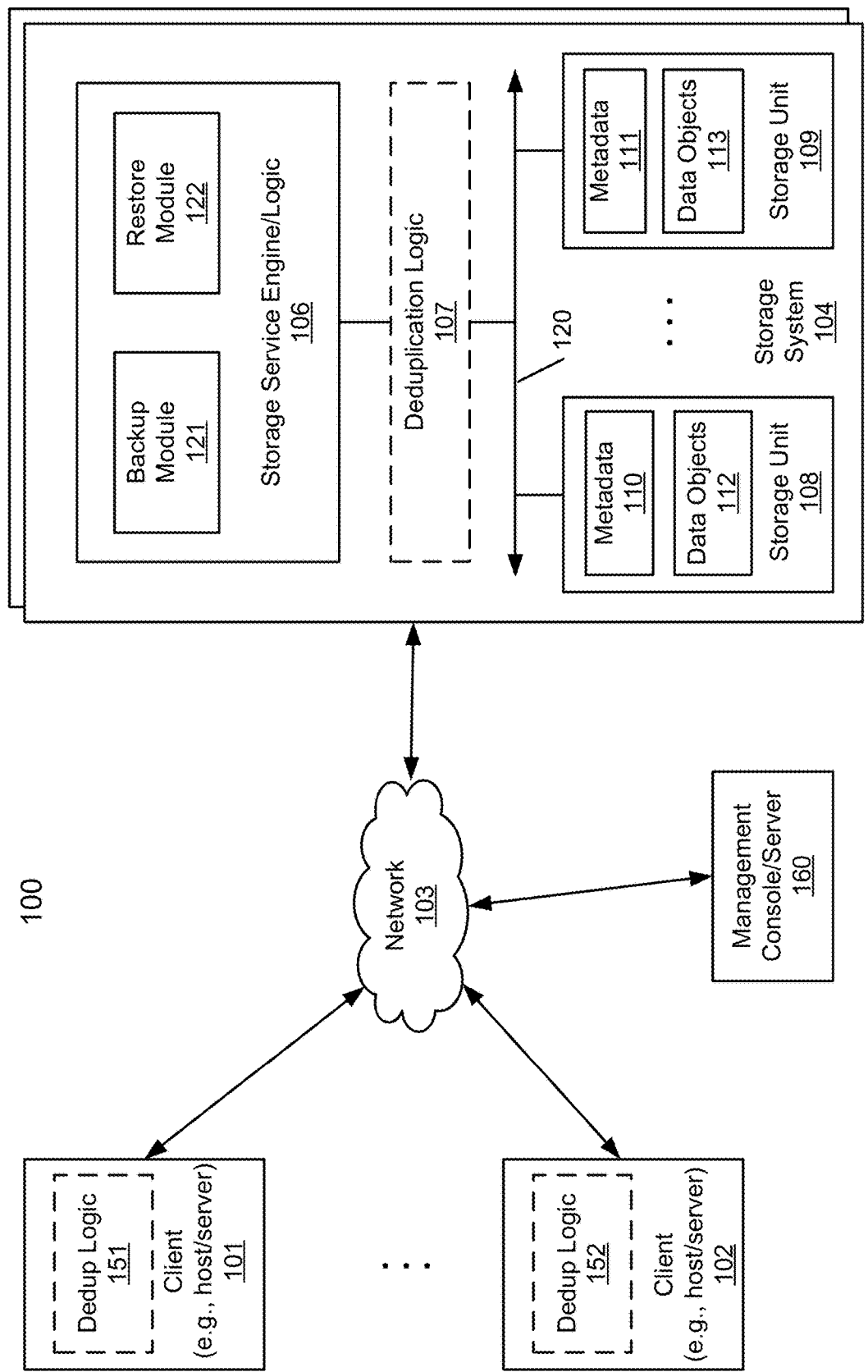
FIG. 1 is a block diagram illustrating a storage system according to one embodiment of the invention.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the disclosure relate to a method, apparatus, and system for storing data at a multi cloud-based storage system. The operations comprise: receiving a data block at a first cloud of a multi cloud-based storage system for storage, the multi cloud-based storage system comprising a first number (n) of clouds; generating the first number (n) of coded blocks at the first cloud based on the data block, wherein the data block is recoverable from any second number (k) out of the first number (n) of coded blocks, and wherein the second number (k) is greater than 1 and less than the first number (n); and distributing, by the first cloud, the first number (n) of coded blocks to the first number (n) of clouds of the multi cloud-based storage system, each of the clouds including the first cloud receiving a respective one of the first number (n) of coded blocks for storage.

In one embodiment, the data block is recoverable in the multi cloud-based storage system with failure of up to (n-k) clouds of the multi cloud-based storage system.

In one embodiment, the data block is not recoverable from fewer than the second number (k) of coded blocks.

In one embodiment, each of the first number (n) of clouds is one of: a public cloud or a private cloud.

In one embodiment, at each of the clouds, the respective one of the first number (n) of coded blocks is first stored in a local cache, and subsequently flushed to disk at approximately a same synchronization moment for all the first number (n) of clouds.

In one embodiment, the first number (n) of coded blocks are generated at the first cloud based on the data block using an error-correcting code, and a size of each of the first number (n) of coded blocks is equal to 1-kth of a size of the data block. In one embodiment, the error-correcting code used is a Reed-Solomon code.

In one embodiment, the operations further comprises: in response to determining that one of the first number (n) of clouds is compromised, blocking read requests from the compromised cloud at all remaining clouds of the multi cloud-based storage system.

FIG. 1 is a block diagram illustrating a storage system according to one embodiment of the invention. Referring to FIG. 1, system 100 includes, but is not limited to, one or more client systems 101-102 communicatively coupled to storage system 104 over network 103. Clients 101-102 may be any type of clients such as a host or server, a personal computer (e.g., desktops, laptops, and tablets), a "thin" client, a personal digital assistant (PDA), a Web enabled appliance, or a mobile phone (e.g., Smartphone), etc. Alternatively, any of clients 101-102 may be a primary storage system (e.g., local data center) that provides storage to other local clients, which may periodically back up the content stored therein to a backup storage system (e.g., a disaster recovery site or system), such as storage system 104. Network 103 may be any type of networks such as a local area network (LAN), a wide area network (WAN) such as the Internet, a fiber network, a storage network, or a combination thereof, wired or wireless. Clients 101-102 may be in physical proximity or may be physically remote from one another. Storage system 104 may be located in proximity to one, both, or neither of clients 101-102.

Storage system 104 may include or represent any type of servers or a cluster of one or more servers (e.g., cloud servers). For example, storage system 104 may be a storage server used for various different purposes, such as to provide multiple users or client systems with access to shared data and/or to back up (or restore) data (e.g., mission critical data). Storage system 104 may provide storage services to clients or users via a variety of access interfaces and/or protocols such as file-based access protocols and block-based access protocols. The file-based access protocols may include the network file system (NFS) protocol, common Internet file system (CIFS) protocol, and direct access file system protocol, etc. The block-based access protocols may include the small computer system interface (SCSI) protocols, Internet SCSI or iSCSI, and Fibre channel (FC) protocol, etc. Storage system 104 may further provide storage services via an object-based protocol and Hadoop distributed file system (HDFS) protocol.

In one embodiment, storage system 104 includes, but is not limited to, storage service engine 106 (also referred to as service logic, service module, or service unit, which may be implemented in software, hardware, or a combination thereof), optional deduplication logic 107, and one or more storage units or devices 108-109 communicatively coupled to each other. Storage service engine 106 may represent any storage service related components configured or adapted to provide storage services (e.g., storage as a service) to a variety of clients using any of the access protocols set forth above. For example, storage service engine 106 may include backup logic 121 and restore logic 122. Backup logic 121 is configured to receive and back up data from a client (e.g., clients 101-102) and to store the backup data in any one or more of storage units 108-109. Restore logic 122 is configured to retrieve and restore backup data from any one or more of storage units 108-109 back to a client (e.g., clients 101-102).

Storage units 108-109 may be implemented locally (e.g., single node operating environment) or remotely (e.g., multi-node operating environment) via interconnect 120, which may be a bus and/or a network (e.g., a storage network or a network similar to network 103). Storage units 108-109 may include a single storage device such as a hard disk, a tape drive, a semiconductor memory, multiple storage devices such as a redundant array system (e.g., a redundant array of independent disks (RAID)), a system for storage such as a library system or network attached storage system, or any other appropriate storage device or system. Some of storage units 108-109 may be located locally or remotely accessible over a network.

In response to a data file to be stored in storage units 108-109, according to one embodiment, deduplication logic 107 is configured to segment the data file into multiple segments (also referred to as chunks) according to a variety of segmentation policies or rules. Deduplication logic 107 may choose not to store a segment in a storage unit if the segment has been previously stored in the storage unit. In the event that deduplication logic 107 chooses not to store the segment in the storage unit, it stores metadata enabling the reconstruction of the file using the previously stored segment. As a result, segments of data files are stored in a deduplicated manner, either within each of storage units 108-109 or across at least some of storage units 108-109. The metadata, such as metadata 110-111, may be stored in at least some of storage units 108-109, such that files can be accessed independent of another storage unit. Metadata of each storage unit includes enough information to provide access to the files it contains.

In one embodiment, referring back to FIG. 1, any of clients 101-102 may further include an optional deduplication logic (e.g., deduplication logic 151-152) having at least a portion of functionalities of deduplication logic 107. Deduplication logic 151-152 are configured to perform local deduplication operations, respectively. For example, prior to transmit data to storage system 104, each of the deduplication logic 151-152 may deduplicate the data into deduplicated segments and determine whether a particular deduplicated segment has already been stored in storage system 104. A deduplicated segment is transmitted to storage system 104 only if the deduplicated segment has not been stored in storage system 104.

For example, when client 101 is about to transmit a data stream (e.g., a file or a directory of one or more files) to storage system 104, deduplication logic 151 is configured to deduplicate the data stream into deduplicated segments. For each of the deduplicated segments, client 101 transmits a fingerprint or representative of the deduplicated segment to storage system 104 to determine whether that particular deduplicated segment has already been stored in storage system 104. A deduplicated segment that has been stored in storage system 104 may be previously received from the same client 101 or from another client such as client 102. In response to a response from storage system 104 indicating that the segment has not been stored in storage system 104, that particular segment is then transmitted over to the storage system 104. As a result, the network traffic or bandwidth and the processing resources required can be greatly reduced.

In one embodiment, storage system 104 further includes a storage manager or storage controller (not shown) configured to manage storage resources of storage system 104, such as, for example, storage space and processing resources (e.g., processor, memory, network resources). The storage manager or controller may be accessed by an administrator of management console or server 160 remotely via a management or configuration interface (not shown). The administrator can provision and manage storage resources based on a set of policies, rules, and/or service level agreements. The storage resources may be virtualized into a pool of virtual storage resources, where underlying physical storage resources represented by the corresponding virtual storage resources may be implemented locally, remotely (e.g., hosted by another storage system), or both. The virtual storage resources can be provisioned, allocated, and/or defined by an administrator or automatically by the storage manager based on a set of software-defined policies. The virtual storage resources may be represented in one or more virtual machines (e.g., virtual storage systems) managed by one or more virtual machine managers (VMMs). Each of the virtual machines can be provisioned to provide a particular type of storage services (e.g., file-based, block-based, object-based, or HDFS) to a client based on a storage policy or service level agreement associated with that particular client as part of software-defined storage services.

The cloud storage is becoming more and more popular. Today all cloud vendors provide multiple options for storage of block devices. Data in the cloud has two major vulnerabilities: 1) Availability: The cloud block storage does not have the availability of on-premises storage (e.g. five nines—99.999% availability). Data may be unavailable or even lost with a probability that may make it unusable for critical applications. 2) Security: A rogue employee at the cloud or a breach at the cloud may cause all data to be accessible by unauthorized personnel, making the data vulnerable to theft or corruption.

Embodiments of the disclosure can accommodate the relatively high latency between the clouds and relate to an asynchronous active/active storage layer which allows access to data on multiple clouds and still provides a higher level of security for the data residing in the cloud, preventing leakage of data to unauthorized parties and at the same time improving the availability.

Hereinafter a cloud may refer to a particular collection of computer system resources at a site that are accessible remotely over a network (e.g., the Internet). Hereinafter the words "cloud" and "site" may be used interchangeably. In a multi cloud-based storage system comprising a plurality of clouds according to one embodiment, the plurality of clouds may communicate with each other and access each other's data over the network. Furthermore, a host external to the multi cloud-based storage system may access the multi cloud-based storage system through accessing one of the plurality of clouds of the system over the network.

A conventional cloud-based storage is associated with a number of drawbacks. For sensitive data stored in a block storage in the cloud, encryption is possible, but if an unauthorized party takes over a computer or the entire environment in the cloud, the encryption will not help. Further, there is no way to block access to the block storage in the cloud remotely if an unauthorized party takes over the account. For example, a rogue employee having access to the cloud account can access the raw data. If the data is encrypted-at-rest, then accessing it through a machine in the cloud bypasses the encryption. Even if the data is encrypted at the source, obtaining the key is possible by taking control of a single machine, and with the key it is possible to access the data directly from the block storage. Moreover, the cloud storage may be associated with a limited availability. A major outage in a single cloud can block access to all the data. Although backups and replicas are possible, there may still be some downtime before the data can be recovered. In addition, cloud sites are sometimes not within synchronous distances. Accordingly, synchronous replication between clouds may be problematic.

Figure 2:
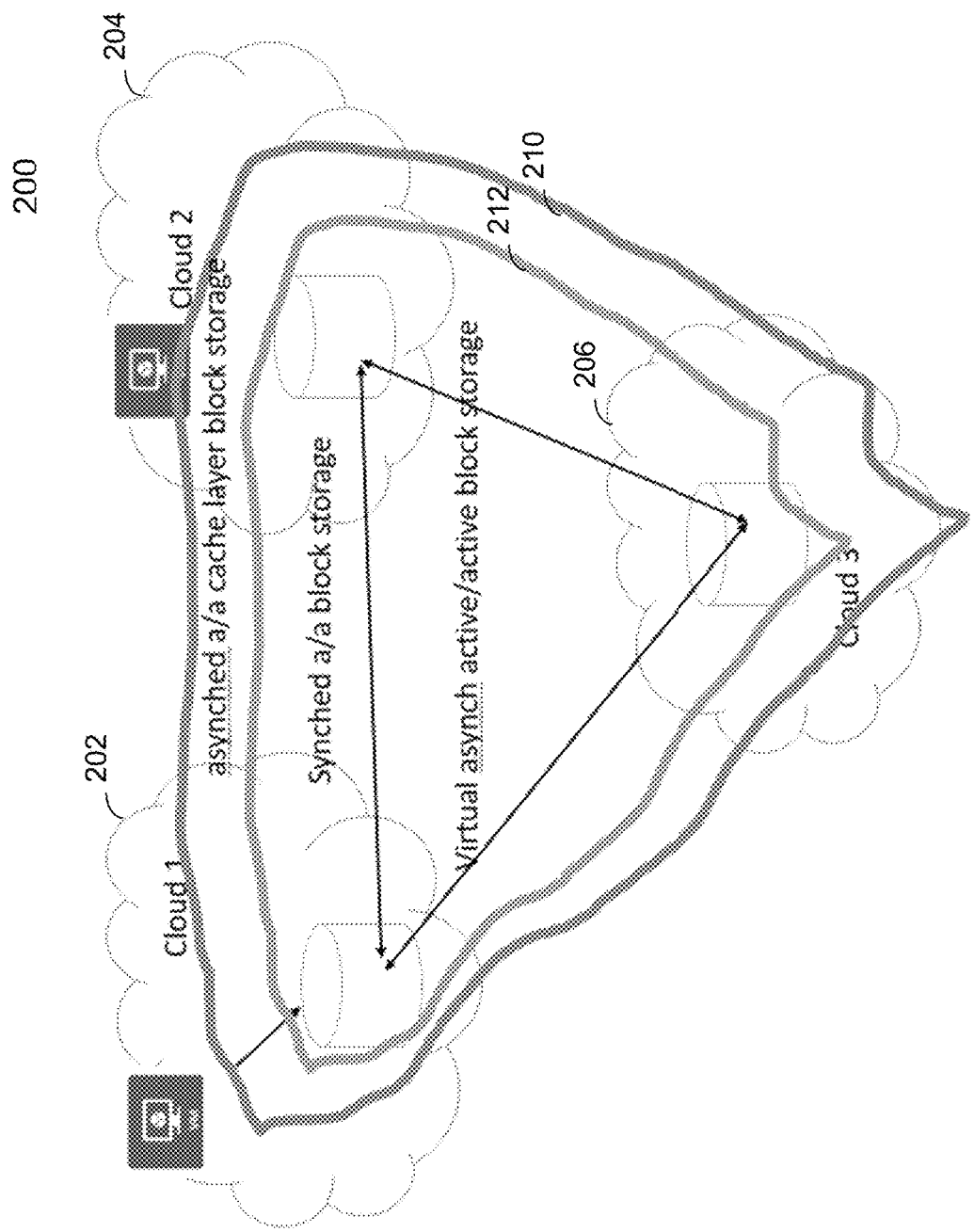
FIG. 2 is a diagram illustrating an example environment in which embodiments may be practiced.

Referring to FIG. 2, a diagram illustrating an example environment 200 in which embodiments may be practiced is shown. The environment 200 comprises a multi cloud distributed asynchronous block storage on three separate clouds 202, 204, 206. Any of the clouds 202, 204, 206 may be a public cloud (e.g., Amazon Web Services "AWS" or Microsoft Azure) or a private cloud that is located at a client's premises. The exposed storage interface may be an active-active asynchronous storage interface similar to that of VPLEX asynchronous product available from Dell® EMC. Thus, the storage may expose block application programming interface (API), and may be accessible from any location within a certain distance. The multi cloud-based storage illustrated in FIG. 2 may comprise a cache layer 210, and a persistency layer 212 that is consistent between all the clouds 202, 204, 206.

With the storage illustrated in FIG. 2, data has to be written locally first at the site writing the data (i.e., one of the clouds 202, 204, 206 that is directly accessed by a host). Periodically a change set may be sent to the other clouds. To provide consistency of the data, the system may use range-based locking. A host trying to write to a logical unit number (LUN) needs to lock the region, as identified by a range (e.g., a 1 megabyte "MB" region), it is writing to. The locking mechanism will coordinate between all sites (all clouds 202, 204, 206), and thus may have a large latency. However, once a host owns a region, a write transaction can be handled locally. Periodically the caches are flushed to the disks to create a consistent point in time.

Data Format at Persistence Layer

The data may be kept in a secret sharing format. For example, given a 4-kilobyte (kB) raw data block, three 2 kB coded blocks may be generated based on the 4 kB raw data block using an error-correcting code (e.g., a polynomial code such as a Reed-Solomon code). Thus, the raw data block may be recovered from any two out of the three coded blocks through a decoding process, but no useful information about the original raw data block can be obtained from any single coded block. Each of the coded blocks may be stored at a respective cloud 202, 204, or 206.

To further explain an example coding process, assuming a raw data block comprising two pieces of data A and B (e.g., A and B can be obtained by splitting the raw data block in half) needs to be stored, a polynomial $P(x)=Ax+B$ may be used to generate the coded blocks. Three example coded blocks $P(1)=A+B$, $P(2)=2A+B$, and $P(3)=3A+B$ may be generated. Thus, A and B can be determined with any two out of the three coded blocks $P(1)$, $P(2)$, and $P(3)$. However, any single coded block (e.g., $P(1)$ alone) gives no useful information about either A or B, or the original raw data block. Each of the coded blocks $P(1)$, $P(2)$, $P(3)$ may be stored at a respective cloud 202, 204, or 206.

Handling Write Command

When a write command arrives at a cloud from a host, the region to which the write command is directed is locked (if the site already owns the lock at the region, the operation takes negligible time). The data is written to the cache based on the write command, and the write is acknowledged. Asynchronously the three coded blocks are generated and sent to the caches of the three clouds 202, 204, 206, where each coded block is sent to the cache of a respective cloud. It should be appreciated that one of the coded blocks is sent to the cache of the local cloud where the write command is executed.

Flushing Caches

Periodically (e.g., every few seconds), the caches are synchronized. In other words, the clouds are quiesced, and a consistent point between the clouds is created. The coded blocks are transmitted to the respective destination caches, so the caches have the updated coded blocks associated with a same time. Once all the coded blocks have arrived at the respective clouds, each cloud flushes the cache to the disk locally.

Handling Read Command

When a cloud receives a read command, it checks whether the relevant region is locked by the local cloud (i.e., the cloud that is handling the read command). If the region is locked by the local cloud, the requested data block according to the read command may be available in the local cache, and therefore the read may be able to be completed locally. Otherwise, an attempt to retrieve the three coded blocks from both the local cloud and the remote clouds may be initiated. Once at least two out of the three coded blocks become available locally, the requested original raw data block may be recovered by decoding the two coded blocks.

Benefit—Availability

Therefore, the data is accessible when any two out of the three clouds are accessible. In other words, the whole storage can survive failure of a single cloud. The data storage is relatively efficient in terms of space efficiency as only 1.5 times the raw data needs to be stored (three coded blocks $P(1)$, $P(2)$, and $P(3)$ stored for every two raw blocks A and B of the same size) for surviving a single failure out of the three clouds. It should be appreciated that this is also the minimum amount of data that needs to be stored to achieve the above-described level of redundancy.

Benefit—Security (Handling Rogue Clouds)

If one of the clouds is no longer trusted (e.g., the cloud is compromised), the read access commands arriving from the untrusted cloud can be blocked at the other two clouds. Even if the environment of a single cloud is fully compromised by an unauthorized party (i.e., the unauthorized party has full access to all the information at the compromised cloud), the unauthorized party will not be able to obtain any useful information about the stored raw data, except for any data that has just been written to the compromised cloud and is still present in its cache, because no useful information about the original data can be derived from a single coded block.

In any case, the original data that is still present in the cache of the compromised cloud is likely negligible compared to the full storage contents.

It should be appreciated that there may be some minor data loss when a cloud becomes compromised. In one embodiment, writes from the compromised cloud may be blocked, and an additional cache flush may be performed at the remaining two clouds. In another embodiment, the remaining two clouds may return to the last flushed point in time. Some minor data loss may occur, and applications that rely on the stored data may need to be restarted.

It should be appreciated that the parameters used in the example described above (e.g., the number of clouds, the level of redundancy achieved, etc.) are for illustrative purposes only, and do not limit the disclosure. For example, a different embodiment may relate to a multi cloud-based storage that comprises five clouds and can tolerate the failure of any two out of the five clouds. Adapting the coding scheme for different embodiments associated with different system parameters is well within the skills of a person of ordinary skill in the art.

Figure 3:
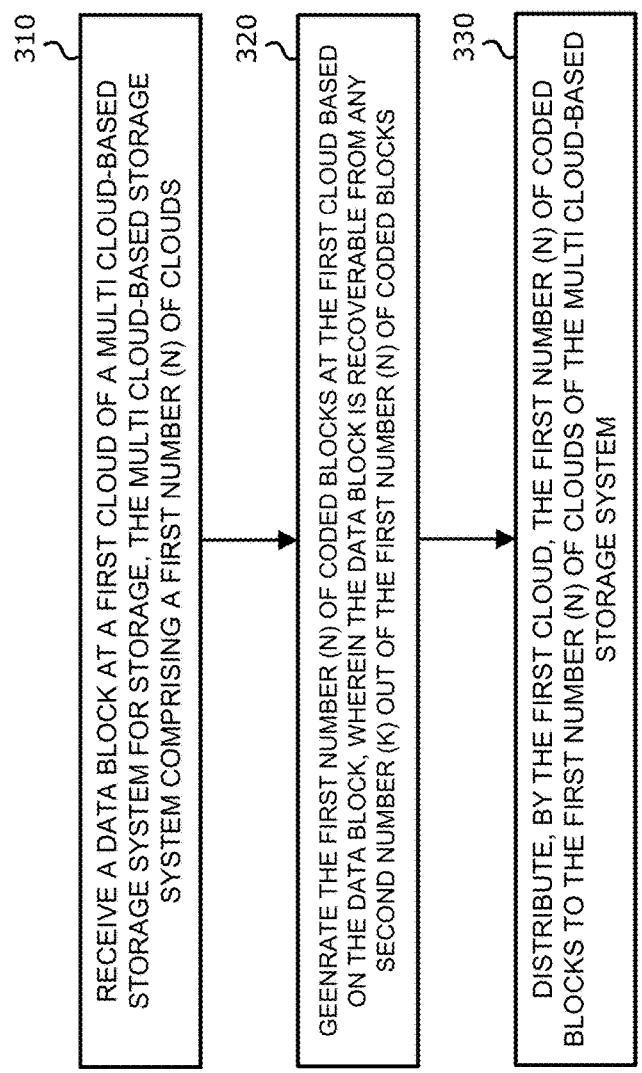
FIG. 3 is a flowchart illustrating an example method for storing data in a multi cloud-based storage system according to one embodiment.

Referring to FIG. 3, a flowchart illustrating an example method 300 for storing data in a multi cloud-based storage system according to one embodiment is shown. Process 300 may be performed by processing logic that includes hardware (e.g. circuitry, dedicated logic, etc.), software (e.g., embodied on a non-transitory computer readable medium), or a combination thereof. For example, process 300 may be performed by processor(s) 1501 of FIG. 4. Referring to FIG. 3, at block 310, a data block may be received at a first cloud of a multi cloud-based storage system for storage, the multi cloud-based storage system comprising a first number (n) of clouds. At block 320, the first number (n) of coded blocks may be generated at the first cloud based on the data block, wherein the data block is recoverable from any second number (k) out of the first number (n) of coded blocks, and wherein the second number (k) is greater than 1 and less than the first number (n). At block 330, the first number (n) of coded blocks may be distributed by the first cloud to the first number (n) of clouds of the multi cloud-based storage system, each of the clouds including the first cloud receiving a respective one of the first number (n) of coded blocks for storage.

In one embodiment, the data block may be recoverable in the multi cloud-based storage system with failure of up to (n-k) clouds of the multi cloud-based storage system. The data block may not be recoverable from fewer than the second number (k) of coded blocks.

In one embodiment, each of the first number (n) of clouds may be one of: a public cloud or a private cloud.

In one embodiment, at each of the clouds, the respective one of the first number (n) of coded blocks may be first stored in a local cache, and subsequently flushed to disk at approximately a same synchronization moment for all the first number (n) of clouds.

In one embodiment, the first number (n) of coded blocks may be generated at the first cloud based on the data block using an error-correcting code, and a size of each of the first number (n) of coded blocks is equal to 1-kth of a size of the data block. In one embodiment, the error-correcting code used is a Reed-Solomon code.

In one embodiment, the operations may further comprise: in response to determining that one of the first number (n) of clouds is compromised, blocking read requests from the compromised cloud at all remaining clouds of the multi cloud-based storage system. It should be appreciated that a single unauthorized party that gains control over fewer than the second number (k) of clouds cannot substantially obtain useful information about the original data stored at the multi cloud-based storage system.

Note that some or all of the components as shown and described above may be implemented in software, hardware, or a combination thereof. For example, such components can be implemented as software installed and stored in a persistent storage device, which can be loaded and executed in a memory by a processor (not shown) to carry out the processes or operations described throughout this application. Alternatively, such components can be implemented as executable code programmed or embedded into dedicated hardware such as an integrated circuit (e.g., an application specific IC or ASIC), a digital signal processor (DSP), or a field programmable gate array (FPGA), which can be accessed via a corresponding driver and/or operating system from an application. Furthermore, such components can be implemented as specific hardware logic in a processor or processor core as part of an instruction set accessible by a software component via one or more specific instructions.

Figure 4:
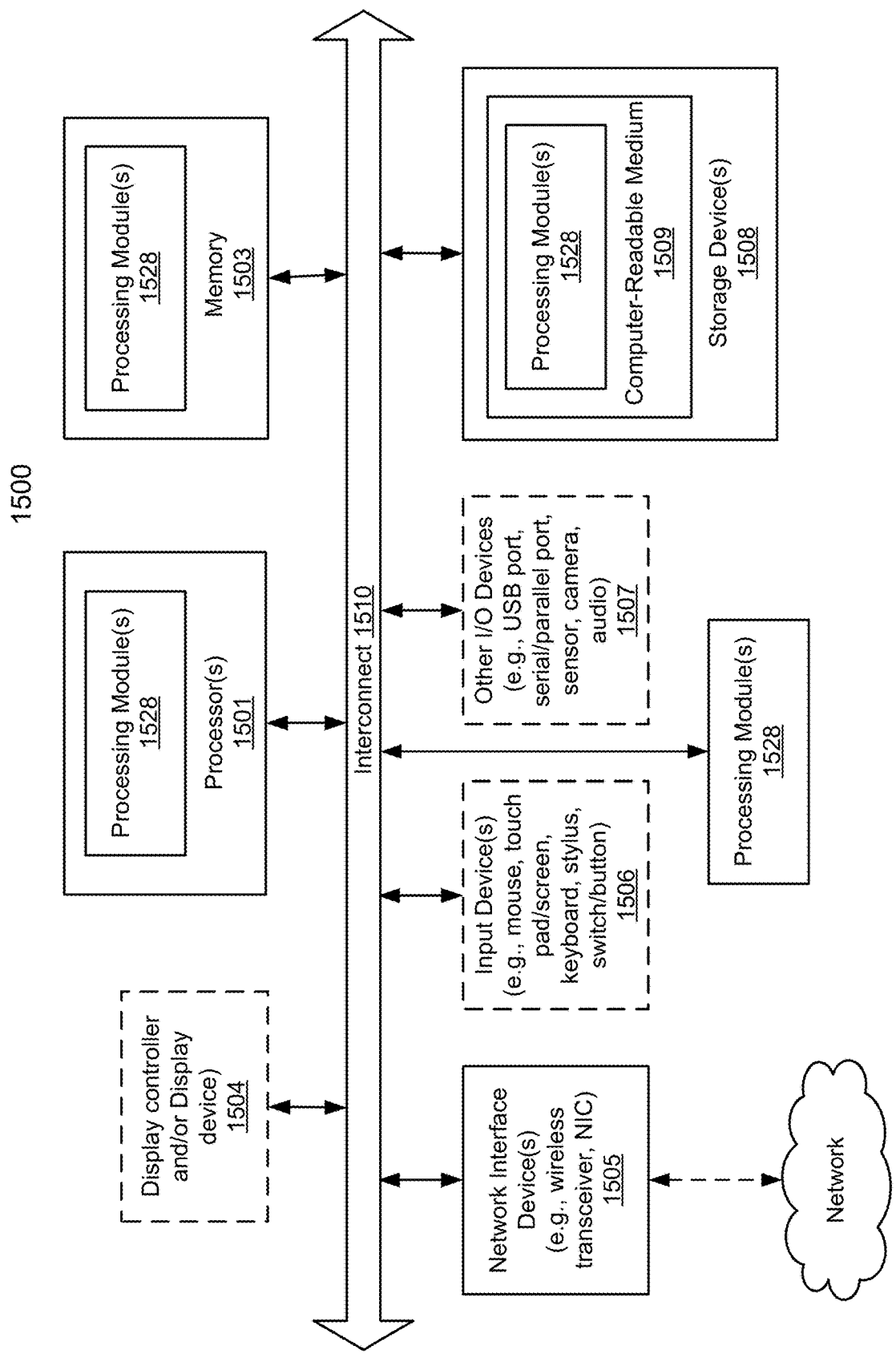
FIG. 4 is a block diagram illustrating a data processing system according to one embodiment.

FIG. 4 is a block diagram illustrating an example of a data processing system which may be used with one embodiment of the invention. For example, system 1500 may represents any of data processing systems described above performing any of the processes or methods described above. System 1500 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 1500 is intended to show a high level view of many components of the computer system. However, it is to be understood that additional components may be present in certain implementations and furthermore, different arrangement of the components shown may occur in other implementations. System 1500 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 1500 includes processor 1501, memory 1503, and devices 1505-1508 via a bus or an interconnect 1510. Processor 1501 may represent a single processor or multiple processors with a single processor core or multiple processor cores included therein. Processor 1501 may represent one or more general-purpose processors such as a microprocessor, a central processing unit (CPU), or the like. More particularly, processor 1501 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 1501 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a coprocessor, an embedded processor, or any other type of logic capable of processing instructions.

Processor 1501, which may be a low power multi-core processor socket such as an ultra-low voltage processor, may act as a main processing unit and central hub for communication with the various components of the system. Such processor can be implemented as a system on chip (SoC). Processor 1501 is configured to execute instructions for performing the operations and steps discussed herein. System 1500 may further include a graphics interface that communicates with optional graphics subsystem 1504, which may include a display controller, a graphics processor, and/or a display device.

Processor 1501 may communicate with memory 1503, which in one embodiment can be implemented via multiple memory devices to provide for a given amount of system memory. Memory 1503 may include one or more volatile storage (or memory) devices such as random access memory (RAM), dynamic RAM (DRAM), synchronous DRAM (SDRAM), static RAM (SRAM), or other types of storage devices. Memory 1503 may store information including sequences of instructions that are executed by processor 1501, or any other device. For example, executable code and/or data of a variety of operating systems, device drivers, firmware (e.g., input output basic system or BIOS), and/or applications can be loaded in memory 1503 and executed by processor 1501. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 1500 may further include IO devices such as devices 1505-1508, including network interface device(s) 1505, optional input device(s) 1506, and other optional IO device(s) 1507. Network interface device 1505 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 1506 may include a mouse, a touch pad, a touch sensitive screen (which may be integrated with display device 1504), a pointer device such as a stylus, and/or a keyboard (e.g., physical keyboard or a virtual keyboard displayed as part of a touch sensitive screen). For example, input device 1506 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 1507 may include an audio device. An audio device may include a speaker and/or a microphone to facilitate voice-enabled functions, such as voice recognition, voice replication, digital recording, and/or telephony functions. Other IO devices 1507 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. Devices 1507 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 1510 via a sensor hub (not shown), while other devices such as a keyboard or thermal sensor may be controlled by an embedded controller (not shown), dependent upon the specific configuration or design of system 1500.

To provide for persistent storage of information such as data, applications, one or more operating systems and so forth, a mass storage (not shown) may also couple to processor 1501. In various embodiments, to enable a thinner and lighter system design as well as to improve system responsiveness, this mass storage may be implemented via a solid state device (SSD). However in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 1501, e.g., via a serial peripheral interface (SPI). This flash device may provide for non-volatile storage of system software, including a basic input/output software (BIOS) as well as other firmware of the system.

Storage device 1508 may include computer-accessible storage medium 1509 (also known as a machine-readable storage medium or a computer-readable medium) on which is stored one or more sets of instructions or software (e.g., processing module, unit, and/or logic 1528) embodying any one or more of the methodologies or functions described herein. Processing module/unit/logic 1528 may represent any of the components described above, such as, for example, a storage service logic, a deduplication engine, as described above. Processing module/unit/logic 1528 may also reside, completely or at least partially, within memory 1503 and/or within processor 1501 during execution thereof by data processing system 1500, memory 1503 and processor 1501 also constituting machine-accessible storage media. Processing module/unit/logic 1528 may further be transmitted or received over a network via network interface device 1505.

Computer-readable storage medium 1509 may also be used to store the some software functionalities described above persistently. While computer-readable storage medium 1509 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of the present invention. The term "computer-readable storage medium" shall accordingly be taken to include, but not be limited to, solid-state memories, and optical and magnetic media, or any other non-transitory machine-readable medium.

Processing module/unit/logic 1528, components and other features described herein can be implemented as discrete hardware components or integrated in the functionality of hardware components such as ASICS, FPGAs, DSPs or similar devices. In addition, processing module/unit/logic 1528 can be implemented as firmware or functional circuitry within hardware devices. Further, processing module/unit/logic 1528 can be implemented in any combination hardware devices and software components.

Note that while system 1500 is illustrated with various components of a data processing system, it is not intended to represent any particular architecture or manner of interconnecting the components; as such details are not germane to embodiments of the present invention. It will also be appreciated that network computers, handheld computers, mobile phones, servers, and/or other data processing systems which have fewer components or perhaps more components may also be used with embodiments of the invention.

Therefore, embodiments of the disclosure relate to a new multi cloud-based storage mechanism that enables increased availability as well as increased security vis-à-vis compromised individual clouds in the system. An unauthorized party that has gained control of a single cloud in the system can obtain little or no useful information.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the invention also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present invention are not described with reference to any particular programming language. It will be appreciated that a variety of programming languages may be used to implement the teachings of embodiments of the invention as described herein.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A computer-implemented method, comprising:
in response to receiving a write command from a host, locking, by a first cloud of a multi cloud-based distributed asynchronous block storage system for storage comprising an asynchronous active/active storage layer, a region in a data block identified by a range to which the write command is directed, wherein the locking coordinates consistency of the data block between all clouds;
receiving a data block at the first cloud of the multi cloud-based distributed asynchronous block storage system for storage, the multi cloud-based distributed asynchronous block storage system comprising a first number (n) of clouds;
generating the first number (n) of coded blocks at the first cloud based on the data block, wherein the data block is recoverable from any second number (k) out of the first number (n) of coded blocks, and wherein the second number (k) is greater than 1 and less than the first number (n), wherein the first number (n) of coded blocks are generated at the first cloud based on the data block using a polynomial code; and
distributing, by the first cloud, the first number (n) of coded blocks to caches of the first number (n) of clouds of the multi cloud-based storage system, each of the caches of the clouds including the first cloud receiving a respective one of the first number (n) of coded blocks for storage, wherein each of the clouds only comprises one of the coded blocks, wherein the generating of the first number (n) of coded blocks at the first cloud based on the data block and the distributing of the first number (n) of coded blocks to caches of the first number (n) of clouds are performed asynchronously.

2. The method of claim 1, wherein the data block is recoverable in the multi cloud-based storage system with failure of up to (n-k) clouds of the multi cloud-based storage system.

3. The method of claim 1, wherein the data block is not recoverable from fewer than the second number (k) of coded blocks.

4. The method of claim 1, wherein each of the first number (n) of clouds is one of:
a public cloud or a private cloud.

5. The method of claim 1, wherein at each of the clouds, the respective one of the first number (n) of coded blocks is first stored in a local cache, and subsequently flushed to disk at approximately a same synchronization moment for all the first number (n) of clouds.

6. The method of claim 1, wherein a size of each of the first number (n) of coded blocks is equal to 1-kth of a size of the data block.

7. The method of claim 6, wherein the polynomial code used is a Reed-Solomon code.

8. The method of claim 1, further comprising: in response to determining that one of the first number (n) of clouds is compromised, blocking read requests from the compromised cloud at all remaining clouds of the multi cloud-based storage system.

9. A non-transitory machine-readable medium having instructions stored therein, which when executed by a processor, cause the processor to perform data storage operations, the operations comprising:
in response to receiving a write command from a host, locking, by a first cloud of a multi cloud-based distributed asynchronous block storage system for storage comprising an asynchronous active/active storage layer, a region in a data block identified by a range to which the write command is directed, wherein the locking coordinates consistency of the data block between all clouds;
receiving a data block at the first cloud of the multi cloud-based distributed asynchronous block storage system for storage, the multi cloud-based distributed asynchronous block storage system comprising a first number (n) of clouds;
generating the first number (n) of coded blocks at the first cloud based on the data block, wherein the data block is recoverable from any second number (k) out of the first number (n) of coded blocks, and wherein the second number (k) is greater than 1 and less than the first number (n), wherein the first number (n) of coded blocks are generated at the first cloud based on the data block using a polynomial code; and
distributing, by the first cloud, the first number (n) of coded blocks to the first number (n) of clouds of the multi cloud-based storage system, each of the clouds including the first cloud receiving a respective one of the first number (n) of coded blocks for storage, wherein each of the clouds only comprises one of the coded blocks, wherein the generating of the first number (n) of coded blocks at the first cloud based on the data block and the distributing of the first number (n) of coded blocks to caches of the first number (n) of clouds are performed asynchronously.

10. The non-transitory machine-readable medium of claim 9, wherein the data block is recoverable in the multi cloud-based storage system with failure of up to (n-k) clouds of the multi cloud-based storage system.

11. The non-transitory machine-readable medium of claim 9, wherein the data block is not recoverable from fewer than the second number (k) of coded blocks.

12. The non-transitory machine-readable medium of claim 9, wherein each of the first number (n) of clouds is one of: a public cloud or a private cloud.

13. The non-transitory machine-readable medium of claim 9, wherein at each of the clouds, the respective one of the first number (n) of coded blocks is first stored in a local cache, and subsequently flushed to disk at approximately a same synchronization moment for all the first number (n) of clouds.

14. The non-transitory machine-readable medium of claim 9, wherein a size of each of the first number (n) of coded blocks is equal to 1-kth of a size of the data block.

15. The non-transitory machine-readable medium of claim 14, wherein the polynomial code used is a Reed-Solomon code.

16. The non-transitory machine-readable medium of claim 9, the operations further comprising: in response to determining that one of the first number (n) of clouds is compromised, blocking read requests from the compromised cloud at all remaining clouds of the multi cloud-based storage system.

17. A data processing system, comprising:
a processor; and
a memory coupled to the processor to store instructions, which when executed by the processor, cause the processor to perform data recovery operations, the operations including:
in response to receiving a write command from a host, locking, by a first cloud of a multi cloud-based distributed asynchronous block storage system for storage comprising an asynchronous active/active storage layer, a region in a data block identified by a range to which the write command is directed, wherein the locking coordinates consistency of the data block between all clouds;
receiving a data block at the first cloud of the multi cloud-based distributed asynchronous block storage system for storage, the multi cloud-based distributed asynchronous block storage system comprising a first number (n) of clouds;
generating the first number (n) of coded blocks at the first cloud based on the data block, wherein the data block is recoverable from any second number (k) out of the first number (n) of coded blocks, and wherein the second number (k) is greater than 1 and less than the first number (n), wherein the first number (n) of coded blocks are generated at the first cloud based on the data block using a polynomial code; and
distributing, by the first cloud, the first number (n) of coded blocks to the first number (n) of clouds of the multi cloud-based storage system, each of the clouds including the first cloud receiving a respective one of the first number (n) of coded blocks for storage, wherein each of the clouds only comprises one of the coded blocks, wherein the generating of the first number (n) of coded blocks at the first cloud based on the data block and the distributing of the first number (n) of coded blocks to caches of the first number (n) of clouds are performed asynchronously.

18. The data processing system of claim 17, wherein the data block is recoverable in the multi cloud-based storage system with failure of up to (n-k) clouds of the multi cloud-based storage system.

19. The data processing system of claim 17, wherein the data block is not recoverable from fewer than the second number (k) of coded blocks.

20. The data processing system of claim 17, wherein each of the first number (n) of clouds is one of: a public cloud or a private cloud.

21. The data processing system of claim 17, wherein at each of the clouds, the respective one of the first number (n) of coded blocks is first stored in a local cache, and subsequently flushed to disk at approximately a same synchronization moment for all the first number (n) of clouds.

22. The data processing system of claim 17, wherein a size of each of the first number (n) of coded blocks is equal to 1-kth of a size of the data block.

23. The data processing system of claim 22, wherein the polynomial code used is a Reed-Solomon code.

24. The data processing system of claim 17, the operations further comprising: in response to determining that one of the first number (n) of clouds is compromised, blocking read requests from the compromised cloud at all remaining clouds of the multi cloud-based storage system.

* * * * *